United States Patent
Laulanet et al.

(10) Patent No.: US 7,696,786 B2
(45) Date of Patent: Apr. 13, 2010

(54) PRECISION DIFFERENTIAL LEVEL SHIFTER

(75) Inventors: Francois Laulanet, Brussels (BE); Cedric Bonaldi, Braine-L'Alleud (BE)

(73) Assignee: ON Semiconductor, Phoenix, AZ (US)

( * ) Notice: Subject to any disclaimer, the term of this patent is extended or adjusted under 35 U.S.C. 154(b) by 0 days.

(21) Appl. No.: 11/369,316

(22) Filed: Mar. 6, 2006

(65) Prior Publication Data

US 2007/0210836 A1  Sep. 13, 2007

(51) Int. Cl.
*H03K 19/0175* (2006.01)
(52) U.S. Cl. .............................. 326/68; 326/81; 326/86; 327/52; 327/333
(58) Field of Classification Search ............. 326/81–83, 326/112, 115, 121, 127, 26, 30, 86–87; 327/100, 327/132, 108–109, 51–52, 56, 560–563, 327/565; 330/258, 146
See application file for complete search history.

(56) References Cited

U.S. PATENT DOCUMENTS

| | | | | |
|---|---|---|---|---|
| 4,618,785 A * | 10/1986 | van Tran | ...................... | 327/53 |
| 4,769,590 A * | 9/1988 | Taylor | ........................ | 323/315 |
| 5,914,630 A * | 6/1999 | Peterson | ..................... | 327/513 |
| 6,954,058 B2 * | 10/2005 | Ota et al. | ..................... | 323/315 |
| 7,274,916 B2 * | 9/2007 | Al-Shyoukh et al. | ........ | 455/130 |
| 7,304,525 B2 * | 12/2007 | Nuebling | .................... | 327/333 |

* cited by examiner

*Primary Examiner*—Vibol Tan
*Assistant Examiner*—Christopher Lo
(74) *Attorney, Agent, or Firm*—Workman Nydegger

(57) ABSTRACT

A differential level shifter employs a variable current mirror to maintain a reference voltage at one output while the other output follows a differential input. Resistor networks allow postproduction trimming of load resistors and the current mirror, resulting in a precise and accurate output of the differential signal. An active cascode circuit enhances current mirror balance and high frequency operation.

25 Claims, 7 Drawing Sheets

PRECISION DIFFERENTIAL LEVEL SHIFTER

BACKGROUND

The present application relates to the field of differential signal transmission and, more particularly, to circuits that shift the common mode level of a differential signal without changing its differential amplitude.

Differential signals are a vital part of modern communication. In a differential signal, the information is not a function of the absolute voltage level on a conductor, but rather the difference of the voltages on a pair of conductors. Differential signals have several advantages over single-ended signals, which travel over a single conductor. Among these advantages are tolerance to outside electrical interference, lower electromagnetic emissions, ability to travel longer distances at higher speeds. Common examples of differential signaling include the local twisted wire pair used to connect telephones, Universal Serial Bus (USB) used in personal computers, and T10/100 connections between computers and routers, switches or modems. The receiver of a differential signal electrically subtracts, or finds the difference of, the value of one conductor from the other to decode the signal.

The noise tolerance features of differential signals are especially useful in high precision transmission where information is in analog form. A typical digital or binary signal might vary three volts to represent a single bit or On/Off piece of information. An analog signal might use the same three-volt range to convey many more (e.g., one thousand) possible different levels. This is accomplished by dividing the three-volt range into one thousand parts or 0.003 volts between adjacent levels. On a single conductor, this small voltage difference is easily corrupted by outside electrical noise sources, such as lightning, power supply noise, the switching on and off of nearby electrical loads, and of particular relevance in automotive applications, Schaffner pulses. This type of electrical noise tends to affect both conductors of a differential pair equally. Because in a differential signal, the signal is the voltage or current difference between conductors, this noise gets subtracted out at the receiver. This gives the differential circuit the ability to tolerate noise even while using small differential voltages.

Typical differential signals are not symmetrical about zero volts but rather vary between two levels, such as 9 and 10 volts. In this example, the average or common mode voltage is 9.5 volts. Theoretically, the common mode voltage is unimportant because the voltage difference is the important carrier of the information. As a practical matter, however, the common mode voltage is often significant because various receiving circuits can only tolerate a limited range of common mode voltage. A family of circuits called differential level shifters adjusts the common mode voltage of a differential signal without corrupting the information carried in the difference of the signal conductors.

Newly developed integrated circuit processes tend to use lower voltages than their predecessors. This may imply that only a lower common mode voltage is tolerable. Additionally, various standards may dictate or allow different, incompatible common mode voltages. Also, a newer, lower voltage integrated circuit process may need to receive a differential signal from an older, higher voltage, differential standard. In all cases, a differential level shifter is required.

Currently, differential level shifters are typically made on integrated circuits or from operational amplifiers and discrete components. It is important that the differential signal not be distorted in the process of shifting the common mode level. If the resistances at the two inputs of a differential receiver differ for example, the differential signal will not be preserved. This can result in inaccuracy and corruption of the signal. To avoid this problem, many differential level shifters use selected, matched, or trimmed components.

As the resolution of the differential signal gets finer and finer, the receiver components must become more precise. For example, a differential signal that encodes 100 levels into 1.0 volt must have precision to at least 0.01 volts or 1%. A signal that encodes 1,000 levels into 1.0 volt must have a precision of 0.001 volt or 0.1%. Because such precision is not common to integrated circuit processes, automated testers perform trimming or adjusting of fabricated integrated circuits. Precision integrated circuits such as differential level shifters may have built-in adjusting and trimming circuits to meet the required accuracy. Automated testers measure the as-built accuracy of the device and then trim various components by way of laser, mechanical, or chemical etching or the selective connection of auxiliary trim components by means of fusible links or semiconductor switches.

Semiconductor switches are a popular trimming means. Trimming circuits can switch trim resistors into or out of a circuit to adjust an overall resistance value. For example, the tester performing the trimming can turn on or off various switches to add or subtract resistance from the resistor being adjusted. Other uses of trimming with switches can add or remove active elements from the circuit to change the overall gain. This technique allows the matching or trimming of currents in circuits such as current mirrors. When the trimming is complete, the tester can destructively blow fuses inside the circuit or program memory elements to make the switch selection permanent.

However, such switches have their own disadvantages. For example, a semiconductor switch is fabricated differently than its corresponding trim resistor. Consequently, the thermal coefficient of resistance, also called the temperature coefficient, is different between the resistor and the switch that controls it. If one resistor is trimmed to match another resistor at a particular temperature, they can drift out of match as the integrated circuit becomes hotter or colder. This thermal drift causes errors in the accuracy of the differential signal. This was less of a problem with earlier designs when the needed precision was not as great. Now, with demands for greater precision, the temperature coefficient of the switch is a greater concern.

SUMMARY

The above-mentioned drawbacks associated with existing differential level shifters are addressed by embodiments of the present application, which will be understood by reading and studying the following specification.

In one embodiment, a circuit for shifting the reference level of a differential signal while preserving its amplitude comprises a negative input terminal and a positive input terminal. The circuit further comprises a first load resistor having a first end and a second end, the first end connected to the negative input terminal, and a second load resistor having a first end and a second end, the first end connected to the positive input terminal. The circuit further comprises a first pass transistor having a first node, a second node and a control node, the first node connected to the second end of the first load resistor to form a negative output terminal, the control node connected to a selected reference voltage signal. The circuit further comprises a current mirror having a first current node, a second current node and a current control node, the first current node connected to the second node of the first pass transistor, the second current node connected to the second end of the second load resistor to form a positive output terminal. The circuit further comprises a first amplifier having a negative input, a positive input and an output, the positive input connected to the negative output terminal, the negative input connected to the selected reference voltage signal, the output connected to the current control node of the current mirror.

In another embodiment, a circuit for shifting the reference level of a differential signal while preserving its amplitude comprises a negative input terminal and a positive input terminal. The circuit further comprises a first load resistor having a first end and a second end, the first end connected to the negative input terminal, and a second load resistor having a first end and a second end, the first end connected to the positive input terminal. At least one of the load resistors comprises a trimmable resistor. The circuit further comprises a trimmable current mirror having a first current node, a second current node and a current control node, the first current node connected to the second end of the first load resistor to form a negative output terminal, the second current node connected to the second end of the second load resistor to form a positive output terminal.

In another embodiment, a method is implemented for trimming a current mirror of a differential level shifter. The level shifter comprises a positive input terminal, a negative input terminal, a positive output terminal, a negative output terminal and a trimmable current mirror. The method comprises: (a) applying a high test voltage to the negative input terminal and measuring the resulting current, $I_{1N}$, into the negative input terminal; (b) applying a high test voltage to the positive input terminal and measuring the resulting current, $I_{1P}$, into the positive input terminal; (c) applying a low test voltage to the negative input terminal and measuring the resulting current, $I_{2N}$, into the negative input terminal; and (d) applying a low test voltage to the positive input terminal and measuring the resulting current, $I_{2P}$, into the positive input terminal. The method further comprises: (e) calculating two ratios $(I_{1N}/I_{2N})$ and $(I_{1P}/I_{2P})$; (f) adjusting the trimmable current mirror; and (g) repeating steps (a) through (f) until the difference between the two ratios is below a selected threshold value.

In another embodiment, a method is implemented for trimming a load resistor of a differential level shifter. The level shifter comprises a positive input terminal, a negative input terminal, a positive output terminal, a negative output terminal and a trimmable load resistor. The method comprises: (a) applying a differential test voltage between the positive input terminal and the negative input terminal; (b) measuring the voltage between the positive output terminal and the negative output terminal; (c) adjusting the trimmable load resistor; and (d) repeating steps (a) through (c) until the difference between the differential test voltage and the measured voltage is below a selected threshold value.

In another embodiment, a method is implemented for trimming a differential level shifter. The level shifter comprises a positive input terminal, a negative input terminal, a positive output terminal, a negative output terminal, a trimmable current mirror, and a trimmable load resistor. The method comprises: (a) applying a high test voltage to the negative input terminal and measuring the resulting current, $I_{1N}$, into the negative input terminal; (b) applying a high test voltage to the positive input terminal and measuring the resulting current, $I_{1P}$, into the positive input terminal; (c) applying a low test voltage to the negative input terminal and measuring the resulting current, $I_{2N}$, into the negative input terminal; (d) applying a low test voltage to the positive input terminal and measuring the resulting current, $I_{2P}$, into the positive input terminal; (e) calculating two ratios $(I_{1N}/I_{2N})$ and $(I_{1P}/I_{2P})$; and (f) adjusting the trimmable current mirror based on the two ratios. The method further comprises: (g) applying a differential test voltage between the positive input terminal and the negative input terminal; (h) measuring the voltage between the positive output terminal and the negative output terminal; and (i) adjusting the trimmable load resistor based on the difference between the applied differential test voltage and the measured voltage.

In another embodiment, a method is implemented for trimming a differential level shifter. The level shifter comprises a positive input terminal, a negative input terminal, a positive output terminal, a negative output terminal, a trimmable current mirror and a trimmable load resistor. The method comprises: (a) applying test voltages to the input terminals and adjusting the trimmable the current mirror based on the resulting currents; and (b) applying a differential signal to the input terminals and adjusting the trimmable load resistor based on the resulting differential output voltage.

In another embodiment, a trimmable resistor comprises a primary resistor, a plurality of secondary resistors, and a plurality of switches. Each switch is in series connection with one of the secondary resistors, and each series connection of a switch and a secondary resistor is in parallel connection with the primary resistor.

In another embodiment, a trimmable resistor string comprises a plurality of trimmable resistors connected in series.

These and other embodiments of the present application will be discussed more fully in the detailed description. The features, functions, and advantages can be achieved independently in various embodiments of the claimed invention, or may be combined in yet other embodiments.

BRIEF DESCRIPTION OF THE DRAWINGS

The accompanying drawings, which are incorporated in and constitute a part of this specification, illustrate exemplary embodiments of the present application.

Like reference numbers and designations in the various drawings indicate like elements.

DETAILED DESCRIPTION

In the following detailed description, reference is made to the accompanying drawings that form a part thereof, and in which is shown by way of illustration specific exemplary embodiments in which the invention may be practiced. These embodiments are described in sufficient detail to enable those skilled in the art to practice the invention, and it is to be understood that modifications to the various disclosed embodiments may be made, and other embodiments may be utilized, without departing from the spirit and scope of the present invention. The following detailed description is, therefore, not to be taken in a limiting sense.

Figure 1:
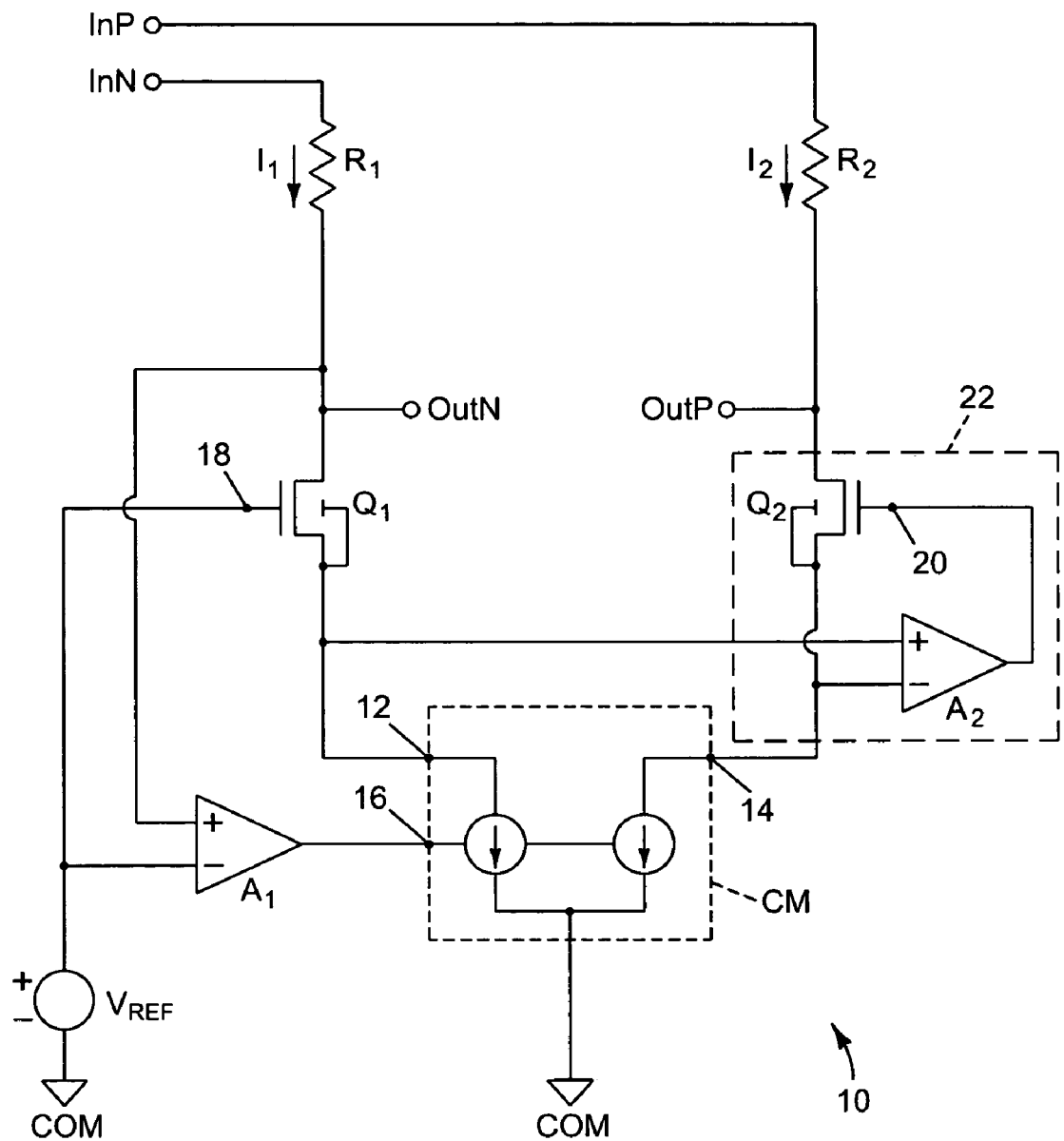
FIG. 1 illustrates a simplified version of a differential level shifter.

FIG. 1 illustrates one embodiment of a differential level shifter 10. A differential input signal is applied to the negative and positive input terminals InN and InP. The resulting currents flow through respective load resistors $R_1$ and $R_2$, through pass transistors $Q_1$ and $Q_2$, and into the first and second current nodes 12, 14 of the current mirror CM. The differential outputs at negative output terminal OutN and positive output terminal OutP, are taken from the end of the load resistors $R_1$ and $R_2$ opposite their respective inputs. The current mirror CM has a current control node 16 driven by amplifier $A_1$. A reference voltage signal $V_{REF}$ provides a voltage to the negative input of amplifier $A_1$ and to the control node 18 of pass transistor $Q_1$. The positive input of amplifier $A_1$ connects to the negative output terminal OutN.

Amplifier $A_1$ forms a feedback circuit which acts to keep negative output terminal OutN at reference voltage signal $V_{REF}$. As the voltage at negative output terminal OutN falls below $V_{REF}$, amplifier $A_1$ decreases the drive at the current control node 16 of current mirror CM. The resulting decrease in current through load resistor $R_1$ reduces the voltage drop across load resistor $R_1$, thereby increasing the voltage at negative output terminal OutN, thus restoring it to the reference voltage signal $V_{REF}$.

In a similar manner, as the voltage at negative output terminal OutN rises above $V_{REF}$, amplifier $A_1$ increases the drive at the current control node 16 of current mirror CM. The resulting increase in current through load resistor $R_1$ increases the voltage drop across load resistor $R_1$, thereby decreasing the voltage at negative output terminal OutN, thus restoring it to the reference voltage signal $V_{REF}$.

Figure 2:
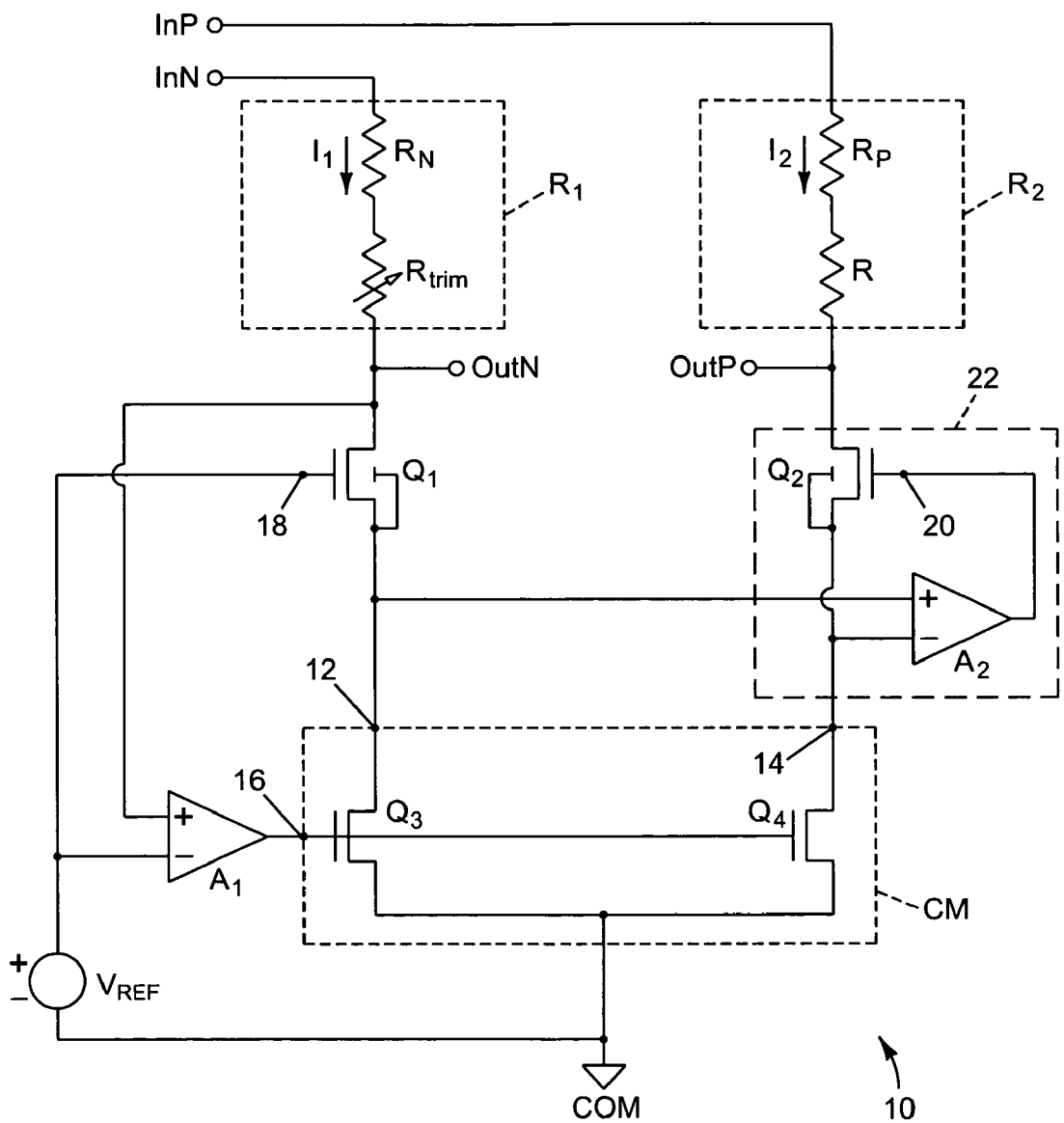
FIG. 2 illustrates a detailed version of the differential level shifter illustrated in FIG. 1.

Therefore, the reference voltage signal $V_{REF}$ and amplifier $A_1$ together maintain the voltage at the negative output terminal at $V_{REF}$. In some embodiments, the reference voltage signal $V_{REF}$ is provided by a reference voltage source, as shown in FIGS. 1 and 2. In other embodiments, the reference voltage signal $V_{REF}$ is supplied as an external input to the differential level shifter 10.

As amplifier $A_1$ varies the drive to the current control node 16 of current mirror CM, the current through the second current node 14 of the current mirror CM changes correspondingly. This variation in current through the second current node of CM causes a variable voltage drop across load resistor $R_2$. The differential voltage across the negative and positive input terminals is transferred to the negative and positive output terminals with OutN being held at $V_{REF}$. Stated algebraically:

$$(InN - I_1 R_1) = V_{REF} = OutN \quad \text{(Equation 1)}$$

$$(InP - I_2 R_2) = OutP \quad \text{(Equation 2)}$$

Setting $R_1 = R_2 = R$ and assuming the same current flows in both resistors due to the current mirror gives:

$$(InN - IR) = V_{REF} = OutN \quad \text{(Equation 1a)}$$

$$(InP - IR) = OutP \quad \text{(Equation 2a)}$$

Subtracting Equation 1a from Equation 2a gives:

$$(InP - InN) = (OutP - OutN) \quad \text{(Equation 3)}$$

Thus, the differential signal at the input terminals is preserved and referenced to the value of $V_{REF}$. Note the assumptions of $R_1 = R_2$, and equal currents through these resistors. Equal currents through both nodes 12, 14 of the current mirror and equal load resistors are two features of the differential level shifter 10 discussed in detail below.

Referring again to FIG. 1, in a manner similar to transistor $Q_1$ and amplifier $A_1$, the positive and negative inputs of amplifier $A_2$ sense the voltage difference between the two current nodes 12, 14 of the current mirror CM. The output of amplifier $A_2$ acts to drive the control node 20 of transistor $Q_2$ so as to maintain the voltage difference between the two current nodes 12, 14 of the current mirror CM substantially equal to zero. This action helps maintain equal currents through both of the current nodes 12, 14 of the current mirror CM. The amplifier $A_2$ advantageously reduces the Miller effect and increases the accuracy of the current mirror CM. This circuit configuration, called an active cascode, also helps to extend the high frequency operation of the current mirror CM. The cascode circuit, derived from the concatenation of the terms "cascaded cathode" acts to reduce the attenuation effects of parasitic capacitance.

In the previous discussion, the transistors $Q_1$ and $Q_2$ were described in general terms using the term "control node" instead of base or gate. In a similar manner, the terms "first node" and "second node" are used instead of collector and emitter, drain and source, or anode and cathode. These general terms are used to emphasize that the circuit of FIGS. 1 and 2 can be implemented with a variety of transistor types, vacuum tubes, or other "electronic valves." Similarly, because current mirror CM can be made to source or sink current, the currents $I_1$ and $I_2$ can flow in the direction illustrated in FIGS. 1 and 2, or in the opposite direction. In addition, the circuit can be made using NPN or PNP bipolar junction transistors, or P channel or N channel field effect transistors. Correspondingly, the amplifiers $A_1$ and $A_2$ may comprise any number of amplifier types including, but not limited to, voltage operational amplifiers, Norton operation amplifiers, operational transconductance amplifiers, differential amplifiers, or other types of amplifiers. Those skilled in the art of analog design will know how to choose a suitable transistor type based upon the differential level shifter application, and how to choose an appropriate amplifier to drive the selected transistor type.

FIG. 2 is a more detailed view of the differential level shifter 10 illustrated in FIG. 1. The earlier discussion emphasized the desirability to match the values of $R_1$ and $R_2$ and to have substantially equal currents flowing in both current nodes 12, 14 of the current mirror CM. Given the variations in component values, some form of post-fabrication trimming is often needed. In some embodiments, the differential level shifter 10 is built on an integrated circuit and the circuit components can be trimmed using the systems and methods described below.

In the embodiment illustrated in FIG. 2, the current mirror CM comprises a pair of transistors $Q_3$ and $Q_4$ with a common control node 16, for example a common gate or a common base. The transistors $Q_3$ and $Q_4$ are fabricated to be substantially identical, in an attempt to have equal currents flow in both current nodes 12, 14 of the current mirror CM. Even so, there are enough variations in semiconductor processes that a slight mismatch of currents is virtually inevitable. The magnitude of the mismatch limits the ability of the differential level shifter 10 to accurately preserve the magnitude of the differential signal applied to the two input terminals InP and InN. Trimming techniques to match the currents in the current mirror are well known to those skilled in the art.

In FIG. 2, the load resistor $R_1$ is expanded into two resistors, $R_N$ in series with $R_{trim}$. Together, $R_N$ in series with $R_{trim}$ forms a trimmable load resistor. $R_2$ is also expanded into $R_P$ and R. $R_{trim}$ allows the two load resistors $R_1$ and $R_2$ to be matched, as discussed below in connection with FIGS. 3, 4 and 6. In general, it is more important that $R_1$ and $R_2$ have substantially the same value than that they have a particular value. In the illustrated embodiment, $R_{trim}$ comprises an adjustable resistor while R comprises a dummy resistor that is sized to correspond to about ½ $R_{trim}$ Max (where $R_{trim\,Max}$ is the maximum resistance value that can be reached by $R_{trim}$).

Figure 3A:
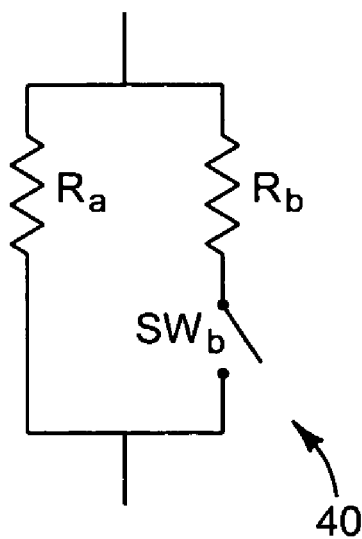
FIG. 3A illustrates a switchable resistor network.

FIG. 3A illustrates a basic switchable resistor network 40. In this simple example, the network 40 can have two possible resistance values: (1) $R_a$ when the switch $SW_b$ is open; and (2) the parallel combination of $R_a$ and $R_b$, or $(R_a \times R_b)/(R_a+R_b)$, when the switch $SW_b$ is closed. In practice, the switch $SW_b$ also has a resistance $R_{sw}$, so the equivalent resistance, $R_{eq}$, of the parallel combination is more accurately described by the following equation:

$$R_{eq}=R_a \times (R_b+R_{sw})/(R_a+R_b+R_{sw}) \quad \text{(Equation 4)}$$

As $R_b$ is allowed to become much greater than $R_{sw}$, the value of $R_{eq}$ approaches the simplified value of $(R_a \times R_b)/(R_a+R_b)$. Taking the derivative of Equation 4 with respect to temperature gives the following equation:

$$\frac{dR_{eq}}{dT} = \frac{\left[\frac{dR_a}{dT}(R_b+R_{sw}) + R_a\left(\frac{dR_b}{dT}+\frac{dR_{sw}}{dT}\right)\right]}{(R_a+R_b+R_{sw}) - R_a(R_b+R_{sw})} \frac{\left(\frac{dR_a}{dT}+\frac{dR_b}{dT}+\frac{dR_{sw}}{dT}\right)}{(R_a+R_b+R_{sw})^2} \quad \text{(Equation 5)}$$

Note that if $(R_b+R_{sw}) \gg R_a$, Equation 5 reduces to the following equation:

$$dR_{eq}/dT \approx dR_a/dT \quad \text{(Equation 6)}$$

Equation 6 indicates that by making $R_b$ much greater than $R_a$, the effects from the temperature dependence of the switch can also be made arbitrarily small.

Figure 3B:
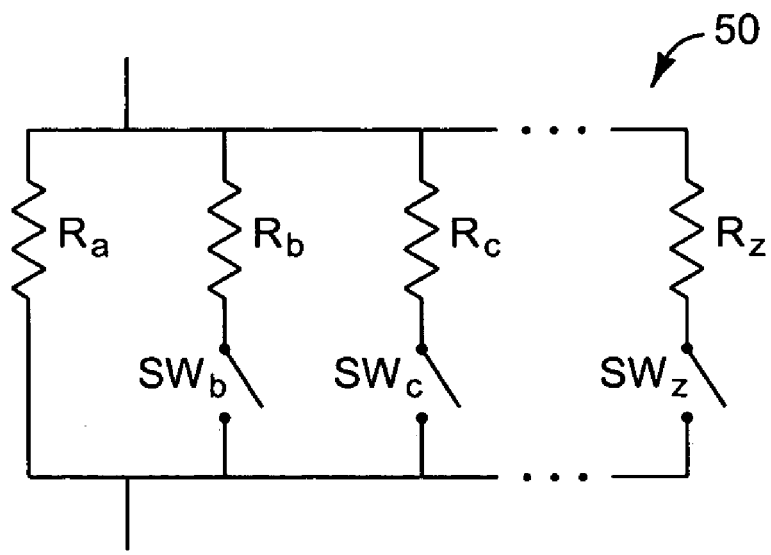
FIG. 3B illustrates a trimmable resistor.

FIG. 3B expands the switchable resistor network concept and provides more adjustability. By adding additional resistor legs, each with a series switch, the resulting switchable resistor network has more possible values. The resistor $R_a$ in FIG. 3B is referred to as the primary resistor, while the resistors $R_b$ through $R_z$ are referred to as secondary resistors. Note that each secondary resistor has its corresponding switch in series. The overall parallel connection forms a trimmable resistor 50.

The trimmable resistor 50 has a maximum value of $R_a$ when all the switches $SW_b$ through $SW_z$ are open and some value less than $R_a$ when one or more of the switches $SW_b$ through $SW_z$ are closed. When $R_b$ through $R_z$ are large compared to the non-zero value of the closed switches $SW_b$ through $SW_z$, the switch resistance has less influence on the overall circuit. This feature can have a significant impact in integrated circuit processes in which the thermal resistance coefficient of a switch is different than the thermal coefficient of the resistor material making up $R_a$ through $R_z$. By making $R_b$ through $R_z$ sufficiently large with respect to the resistance of a closed switch $SW_b$ through $SW_z$, the effects of differing thermal coefficients of resistance can be made arbitrarily small. Additionally, any number of resistors $R_b$ through $R_z$ can be utilized to accomplish the desired trimming. The resistors can have various resistance values and can be chosen to give good coverage within the designed trimming range.

Figure 4:
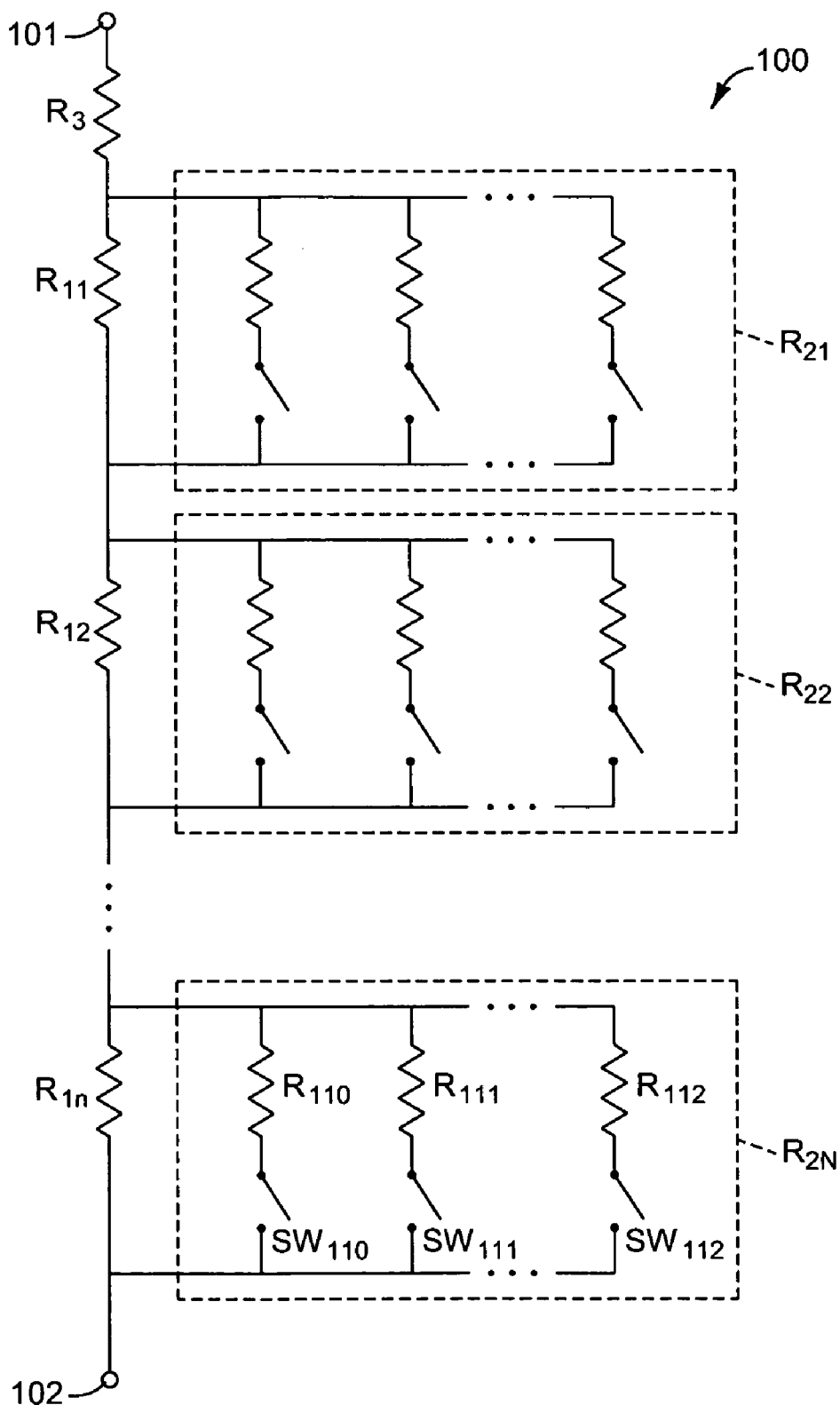
FIG. 4 illustrates a trimmable resistor string.

FIG. 4 illustrates a trimmable resistor string 100 comprising an analog input terminal 101 for connection to a resistor $R_3$ to be tuned and an analog output terminal 102. Those of ordinary skill in the art will appreciate that the roles of terminals 101 and 102 can be changed, e.g., terminal 101 may be used as an output terminal and terminal 102 may be used for connection to a resistor to be tuned.

The resistor string 100 comprises a plurality of primary, or "first arm," resistors $R_{11}$, $R_{12}$ through $R_{1N}$, which are serially connected with the input and output terminals 101 and 102. The resistors $R_{11}$, $R_{12}$ through $R_{1N}$ have determined but not necessarily identical resistance values. Collectively, resistors $R_{11}$, $R_{12}$ through $R_{1N}$, are referred to as a series string of resistors. A series of switchable resistor networks, or "shunt arms," $R_{21}$, $R_{22}$ through $R_{2N}$ are connected in parallel with some or all of the primary resistors $R_{11}$, $R_{12}$ through $R_{1N}$. The switchable resistor network $R_{2N}$ shows the secondary resistors $R_{110}$, $R_{111}$ and $R_{112}$, together with corresponding switches $SW_{110}$, $SW_{111}$, and $SW_{112}$.

In the illustrated embodiment, each shunt arm includes a resistor connected in series with a switch having a first open position in which the resistor of the shunt arm is not connected to a first arm resistor and a second closed position in which the resistor of the shunt arm is connected in parallel with the same first arm resistor. As a result, the resistance of the resistor string 100 can be varied over a desired range of resistance values by selectively controlling the positions of the switches. For example, as shown in FIG. 4, the shunt resistors $R_{110}$, $R_{111}$ and $R_{112}$, may be independently connected in parallel with the first arm resistor $R_{1N}$ when the switches $SW_{110}$, $SW_{111}$, and $SW_{112}$ are selectively closed. The switches in the shunt arms can be controlled by independent digital signals not shown in FIG. 4, using a variety of techniques that are well-known to those of ordinary skill in the art.

In some embodiments, the first arm resistors $R_{11}$, $R_{12}$ through $R_{1N}$ have decreasing resistance values, i.e., the resistance of first arm resistor $R_{11}$ is higher than the resistance value of first arm resistor $R_{12}$, etc. For example, in some embodiments, the first arm resistors $R_{11}$, $R_{12}$ through $R_{1N}$ have resistance values that vary according to a geometric progression with a common ratio substantially equal to about ½. The resistance value of the resistors in the shunt arms can be determined by the resistance value of their corresponding first arm resistor.

As discussed above, it is generally desirable to select resistance values for the shunt arm resistors that are significantly greater than the corresponding first arm resistors $R_{11}$, $R_{12}$ through $R_{1N}$ to minimize the effect of temperature on the precision of the resistor string 100. By selecting appropriate resistance values for the first arm resistors $R_{11}$, $R_{12}$ through $R_{1N}$ and the shunt arm resistors, the resistor string 100 can be advantageously substantially unaffected by the parasitic resistance of the switches in the shunt arms over a wide range of temperature.

For a given trimming precision, it is possible to increase the trimming range by increasing the number of first arm resistors $R_{11}$, $R_{12}$ through $R_{1N}$. This will also multiply the number of shunt arm resistors with resistance values orders of magnitude higher than the corresponding first arm resistors $R_{11}$, $R_{12}$ through $R_{1N}$. In common integrated circuit technologies, resistors having relatively high resistance values typically occupy significant amounts of surface area on the substrate, which is not desired. Therefore, by using decreasing resistance values for the plurality of first arm resistors $R_{11}$, $R_{12}$ through $R_{1N}$ with shunt resistors having significantly greater resistance values, a number of advantages can be accomplished. For example, the temperature behavior of the resistor string 100 can be made arbitrarily close to that of the resistor $R_3$ to be tuned and that of the resistor (e.g., $R_2$) to be matched. In addition, a given trimming range can be achieved with a relatively high degree of trimming precision, while limiting the surface area on the substrate occupied by the resistors in the shunt arms.

Figure 5:
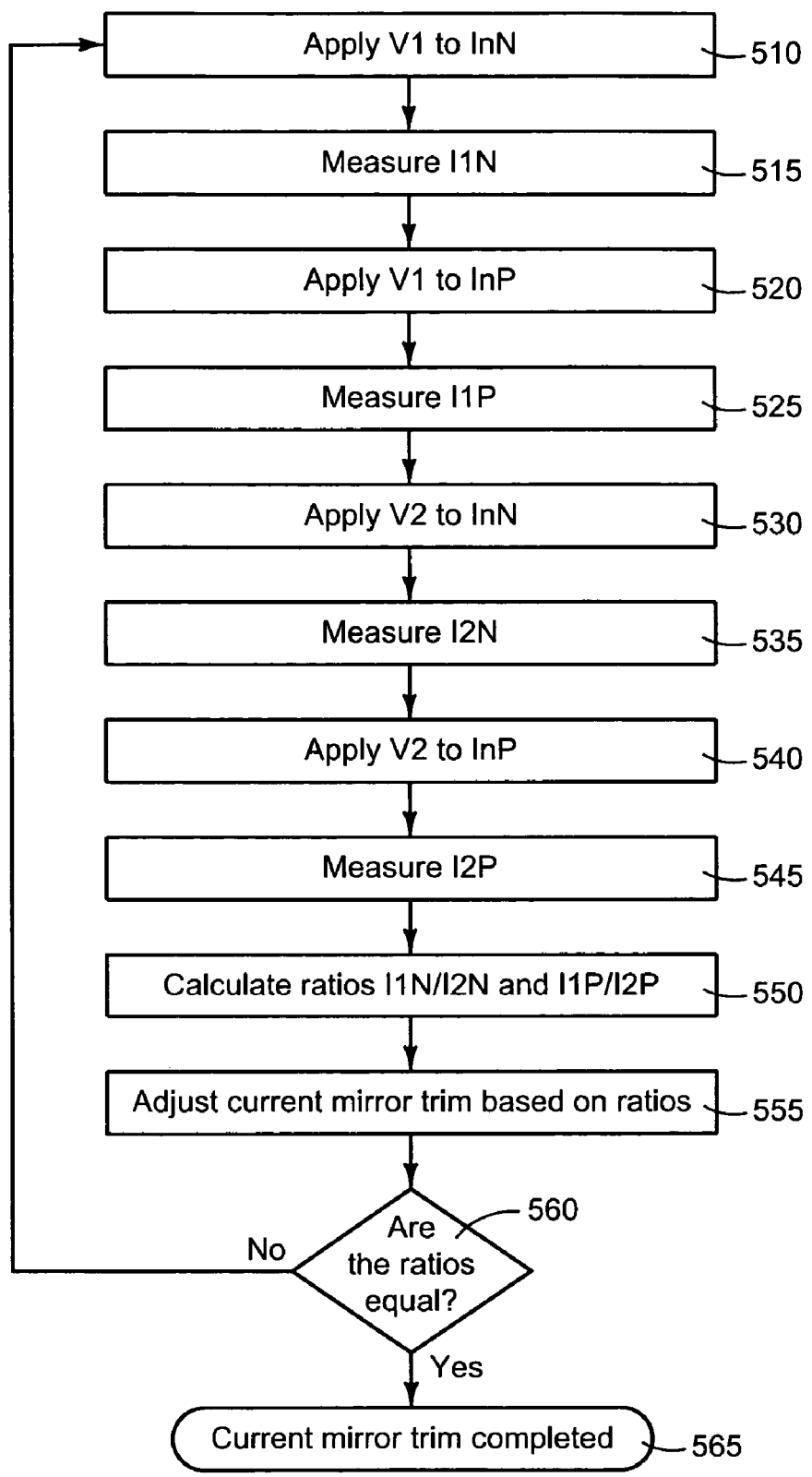
FIG. 5 illustrates a method flow for trimming a current mirror.

Once the differential level shifter 10 has been manufactured, the current mirror CM is typically trimmed to obtain substantially equal currents in both current nodes 12, 14. FIG. 5 illustrates one exemplary method for trimming the current mirror CM. With the shifter 10 under power, typically in an automated tester, a voltage $V_1$ is applied to the negative input terminal InN, as shown at block 510. $V_1$ is typically at the high end of the voltage range expected at the input InN during normal operation. The resulting current $I_{1N}$ into input terminal InN is measured at block 515. At block 520, $V_1$ is also applied to the positive input terminal InP, and the resulting current $I_{1P}$ is measured at block 525. At block 530, a voltage $V_2$ is applied to the negative input terminal InN. $V_2$ is typically at the low end of the voltage range expected at the input InN during normal operation. The resulting current $I_{2N}$ into input terminal InN is measured at block 535. At block 540, $V_2$ is also applied to the positive input terminal InP, and the resulting current $I_{2P}$ is measured at block 545.

Those of ordinary skill in the art will understand that the sequence of steps may vary from that illustrated in FIG. 5. For example, in some embodiments, $V_2$ is applied before $V_1$ and/or the test voltage is applied at InP before InN or is applied simultaneously. At block 550, the two ratios $I_{1N}/I_{2N}$ and $I_{1P}/I_{2P}$ are calculated. If the ratios are substantially equal, the current mirror CM does not require (further) trimming, and no current mirror adjustment is needed. If the ratios are not substantially equal, the tester algorithm can choose a trim value based on the values of the unequal ratios at block 555. The resulting trim values will control the appropriate trim switches inside the trim circuitry of the current mirror CM. If a trim is needed, the decision block 560 returns the procedure to block 510 to re-measure the affects of the new trim setting. If the ratios are substantially equal, the trim procedure is complete at block 565.

Figure 7:
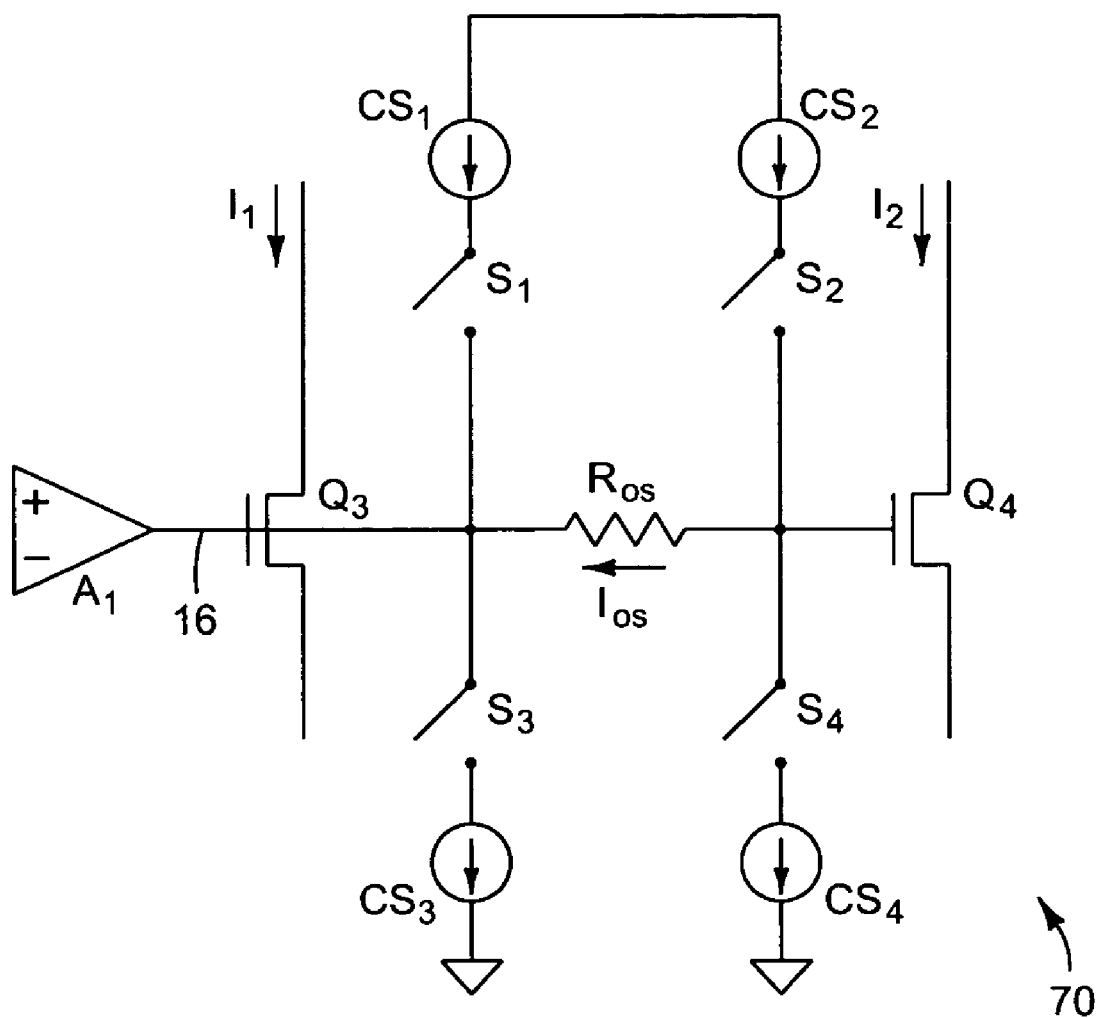
FIG. 7 illustrates a trimmable current mirror.

FIG. 7 illustrates one exemplary circuit for a trimmable current mirror 70. If transistors $Q_3$ and $Q_4$ have different threshold voltages $V_t$, the same control voltage at current control node 16 will cause the currents $I_1$ and $I_2$ to be unequal. Forcing a current $I_{OS}$ though the offset resistor $R_{OS}$, will cause a different voltage to be applied to the gates of $Q_3$ and $Q_4$. This voltage difference or offset voltage compensates for the different threshold voltages of $Q_3$ and $Q_4$. Four current sources, $CS_1$ through $CS_4$ and associated switches $S_1$ through $S_4$ act to steer current through the offset resistor $R_{OS}$.

If $S_2$ and $S_3$ are closed while $S_1$ and $S_4$ are open, current will flow through $R_{OS}$ in the direction indicated by $I_{OS}$ in FIG. 7. Thus, the gate of $Q_4$ will be at a higher voltage than the gate of $Q_3$ by an amount equal to $I_{OS} \times R_{OS}$. Similarly, if $S_2$ and $S_3$ are open while $S_1$ and $S_4$ are closed, current will flow through $R_{OS}$ opposite the direction indicated by $I_{OS}$ in FIG. 7. Thus the gate of $Q_4$ will be at a lower voltage than the gate of $Q_3$ by an amount equal to $I_{OS} \times R_{OS}$. If all switches $S_1$ through $S_4$ are open, the gates of $Q_3$ and $Q_4$ will be at the same voltage because $I_{OS} \times R_{OS} = 0$.

The trimmable current mirror 70 illustrated in FIG. 7 enables the threshold voltage between the transistors $Q_3$ and $Q_4$ to be adjusted, thereby allowing the currents at the current nodes 12, 14 to be made substantially equal. Similar circuits and methods can be used to adjust the beta in bipolar junction transistor applications, using components and techniques that are known to those skilled in the art of analog integrated circuit design.

Figure 6:
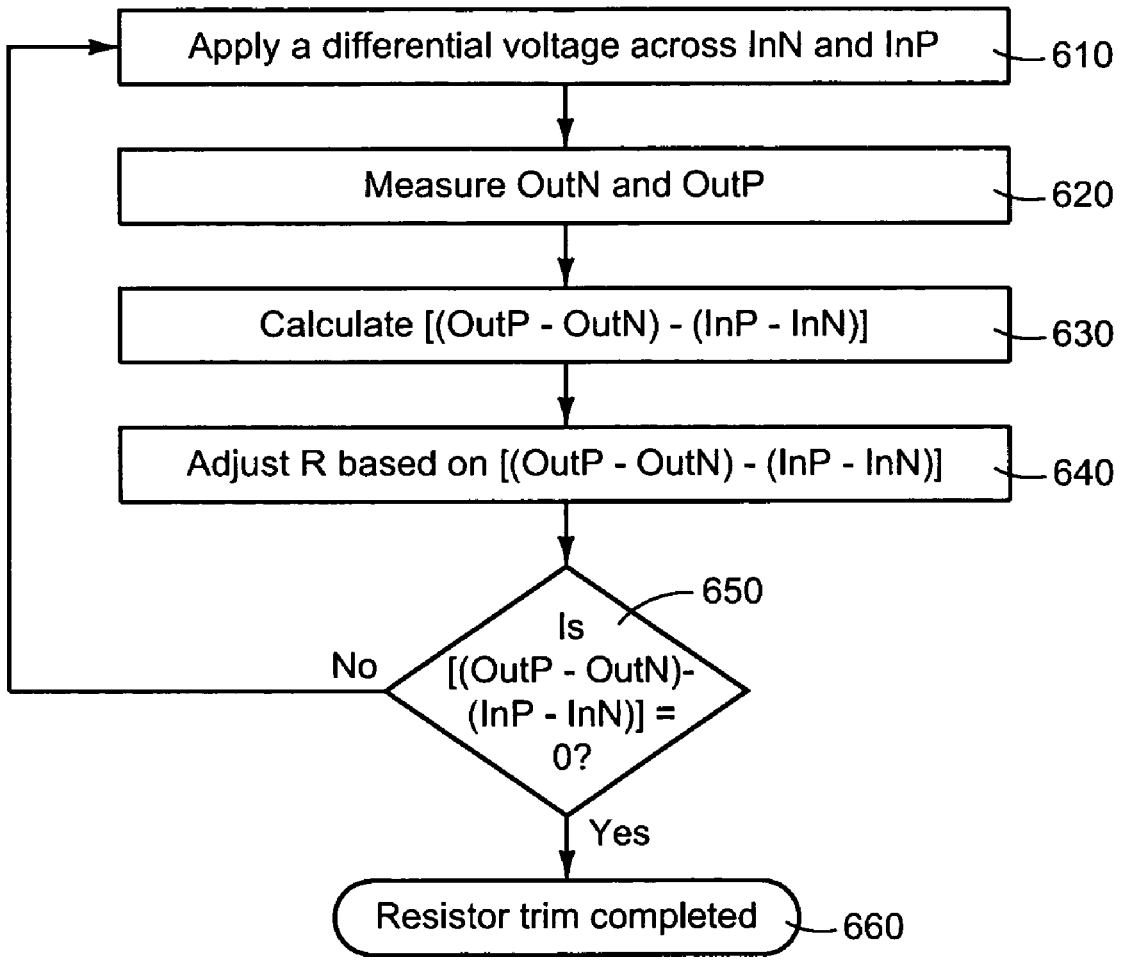
FIG. 6 illustrates a method flow for trimming a load resistor.

Once the differential level shifter 10 has been manufactured, the load resistors $R_1$ and $R_2$ are preferably trimmed to match resistance values. Typically, only one resistor needs to be trimmed to achieve matched resistance values between the two load resistors $R_1$ and $R_2$. FIG. 6 illustrates one exemplary method for trimming the load resistors $R_1$ and $R_2$, which is usually performed with an automated tester and the device under power. At block 610, a differential test voltage is applied across input terminals InN and InP. At block 620, the outputs at OutN and OutP are measured. At block 630, the difference between the differential input voltage and the differential output voltage, or [(OutP−OutN)−(InP−InN)], is calculated. The difference between the differential input voltage and the differential output voltage determines the amount of trim needed for the load resistors at block 640. If the difference is zero or below a selected threshold value, the decision block 650 moves the procedure to completion at block 660. If the difference is above the selected threshold value, the procedure returns to block 610 to re-measure and repeat the trim process.

The systems and methods described herein present a number of distinct advantages over conventional differential level shifters. For example, using the systems and methods described above, the differential level shifter 10 can be tuned by trimming both a current mirror and a load resistor using a single pair of input and output terminals. As a result, post-fabrication adjustment of the differential level shifter 10 can be accomplished using simpler automated testing equipment, and faster trim cycles can be realized.

Although this invention has been described in terms of certain preferred embodiments, other embodiments apparent to those of ordinary skill in the art, including embodiments that do not provide all of the features and advantages set forth herein, are also within the scope of this invention. Accordingly, the scope of the present invention is defined only by reference to the appended claims and equivalents thereof.

What is claimed is:

1. A circuit for shifting the reference level of a differential signal while preserving its amplitude, the circuit comprising:
    a negative input terminal;
    a positive input terminal;
    a first load resistor having a first end and a second end, the first end connected to the negative input terminal;
    a second load resistor having a first end and a second end, the first end connected to the positive input terminal;
    a first pass transistor having a first node, a second node and a control node, the first node connected to the second end of the first load resistor to form a negative output terminal, the control node connected to a selected reference voltage signal;
    a current mirror having a first current node, a second current node and a current control node, the first current node connected to the second node of the first pass transistor, the second current node connected to the second end of the second load resistor to form a positive output terminal; and
    a first amplifier having a negative input, a positive input and an output, the positive input connected to the negative output terminal, the negative input connected to the selected reference voltage signal, the output connected to the current control node of the current mirror.

2. The circuit of claim 1, further comprising an active cascode circuit connected to the first and second current nodes of the current mirror and to the second end of the second load resistor at the positive output terminal.

3. The circuit of claim 2, wherein the active cascode circuit comprises:
    a second pass transistor having a control node, the second pass transistor connected in series between the second end of the second load resistor and the second current node of the current mirror; and
    a second amplifier having a negative input, a positive input and an output, the negative input of the second amplifier connected to the second current node of the current mirror, the positive input of the second amplifier connected to the first current node of the current mirror, and output of the second amplifier connected to the control node of the second pass transistor.

4. The circuit of claim 3, wherein the first and second amplifiers comprise a voltage operational amplifier, a Norton operation amplifier, an operational transconductance amplifier and/or a differential amplifier.

5. The circuit of claim 1, wherein the current mirror comprises one or more bipolar transistors and/or metal oxide semiconductor transistors.

6. The circuit of claim 1, wherein at least one of the two load resistors comprises a trimmable resistor capable of adjusting the load resistors to have substantially equal resistance values.

7. The circuit of claim 1, wherein at least one of the load resistors comprises a series string of resistors, at least one of the resistors in the series string being connected in parallel with a switchable resistor network comprising a parallel connection of resistors, each connected in series with a switch, wherein the resistance values of the series string of resistors vary according to a geometric progression with a common ratio substantially equal to about ½.

8. The circuit of claim 1, further comprising a reference voltage source that provides the selected reference voltage signal.

9. A circuit for shifting the reference level of a differential signal while preserving its amplitude, the circuit comprising:
a negative input terminal;
a positive input terminal;
a first load resistor having a first end and a second end, the first end connected to the negative input terminal;
a second load resistor having a first end and a second end, the first end connected to the positive input terminal,
wherein at least one of the load resistors comprises a trimmable resistor;
a trimmable current mirror having a first current node, a second current node and a current control node, the current mirror configured to mirror the current passing through the first current node and the first load resistor and the current passing through the second current node and the second resistor such that the current passing through the first and second current nodes are mirrored to each other, the first current node connected to the second end of the first load resistor to form a negative output terminal, the second current node connected to the second end of the second load resistor to form a positive output terminal,
wherein the trimmable resistor comprises a series string of resistors, at least one of the resistors in the series string being connected in parallel with a switchable resistor network comprising a parallel connection of resistors, each connected in series with a switch, wherein the resistance values of the series string of resistors vary according to a geometric progression with a common ratio substantially equal to about ½.

10. The circuit of claim 9, wherein the trimmable current mirror further comprises:
a plurality of current sources;
a plurality of switches; and
an offset resistor,
wherein the current sources, switches and offset resistor are connected in an H-bridge.

11. The circuit of claim 9, wherein one of the load resistors comprises a non-trimmable resistor that is sized to correspond to about ½ the maximum resistance value that can be reached by the trimmable resistor.

12. A circuit for shifting the reference level of a differential signal while preserving its amplitude, the circuit comprising:
a negative input terminal;
a positive input terminal;
a first load resistor having a first end and a second end, the first end connected to the negative input terminal;
a second load resistor having a first end and a second end, the first end connected to the positive input terminal,
wherein at least one of the load resistors comprises a trimmable resistor;
a trimmable current mirror having a first current node, a second current node and a current control node, the trimmable current mirror configured to mirror the current passing through the first current node and the first load resistor and the current passing through the second current node and the second resistor such that the current passing through the first and second current nodes are mirrored to each other, the first current node connected to the second end of the first load resistor to form a negative output terminal, the second current node connected to the second end of the second load resistor to form a positive output terminal; and
a first pass transistor having a first node, a second node and a control node, the first node and second node connected in series between the second end of the first load resistor and the first current node of the trimmable current mirror.

13. The circuit of claim 12, further comprising a first amplifier having a negative input, a positive input and an output, the negative input connected to a selected reference voltage signal, the positive input connected to the negative output terminal, and the output connected to the current control node of the current mirror.

14. The circuit of claim 13, wherein the first amplifier comprises a voltage operational amplifier, a Norton operation amplifier, an operational transconductance amplifier or a differential amplifier.

15. A circuit for shifting the reference level of a differential signal while preserving its amplitude, the circuit comprising:
a negative input terminal;
a positive input terminal;
a first load resistor having a first end and a second end, the first end connected to the negative input terminal;
a second load resistor having a first end and a second end, the first end connected to the positive input terminal,
wherein at least one of the load resistors comprises a trimmable resistor;
a trimmable current mirror having a first current node, a second current node and a current control node, the current mirror configured to mirror the current passing through the first current node and the first load resistor and the current passing through the second current node and the second resistor such that the current passing through the first and second current nodes are mirrored to each other, the first current node connected to the second end of the first load resistor to form a negative output terminal, the second current node connected to the second end of the second load resistor to form a positive output terminal;
a pass transistor having a first node, a second node and a control node, the first node and second node connected in series between the second end of the second load resistor and the second current node of the trimmable current mirror; and
an amplifier having a negative input, a positive input and an output, the positive input of the amplifier connected to the first current node of the trimmable current mirror, the negative input of the amplifier connected to the second current node of the trimmable current mirror, and output of the second amplifier connected to the control node of the pass transistor.

16. The circuit of claim 15, wherein the second amplifier comprises a voltage operational amplifier, a Norton operation amplifier, an operational transconductance amplifier or a differential amplifier.

17. The circuit of claim 9, wherein the first load resistor is structured such that all or substantially all of the current that passes through the first load resistor also passes through the first current node of the trimmable current mirror, and all or substantially all of the current that passes through the first current node of the trimmable current mirror had previously passed through the first load resistor.

18. The circuit of claim 17, wherein the second load resistor is structured such that all or substantially all of the current that passes through the second load resistor also passes through the second current node of the trimmable current mirror, and all or substantially all of the current that passes through the second current node of the trimmable current mirror had previously passed through the second load resistor.

19. The circuit of claim 12, wherein the trimmable resistor comprises a series string of resistors, at least one of the resistors in the series string being connected in parallel with a switchable resistor network comprising a parallel connection of resistors, each connected in series with a switch, wherein the resistance values of the series string of resistors vary according to a geometric progression with a common ratio substantially equal to about ½.

20. The circuit of claim 12, wherein the trimmable current mirror further comprises:
- a plurality of current sources;
- a plurality of switches; and
- an offset resistor,
- wherein the current sources, switches and offset resistor are connected in an H-bridge.

21. The circuit of claim 15, wherein the trimmable resistor comprises a series string of resistors, at least one of the resistors in the series string being connected in parallel with a switchable resistor network comprising a parallel connection of resistors, each connected in series with a switch, wherein the resistance values of the series string of resistors vary according to a geometric progression with a common ratio substantially equal to about ½.

22. The circuit of claim 15, wherein the trimmable current mirror further comprises:
- a plurality of current sources;
- a plurality of switches; and
- an offset resistor,
- wherein the current sources, switches and offset resistor are connected in an H-bridge.

23. The circuit of claim 15, wherein one of the load resistors comprises a non-trimmable resistor that is sized to correspond to about ½ the maximum resistance value that can be reached by the trimmable resistor.

24. The circuit of claim 12, wherein one of the load resistors comprises a non-trimmable resistor that is sized to correspond to about ½ the maximum resistance value that can be reached by the trimmable resistor.

25. The circuit of claim 12, further comprising an active cascode circuit, the active cascode circuit comprising: a second pass transistor having a first node, a second node and a control node, the first node and second node connected in series between the second end of the second load resistor and the second current node of the current mirror; and an amplifier having a negative input, a positive input and an output, the positive input of the amplifier connected to the first current node of the current mirror, the negative input of the amplifier connected to the second current node of the current mirror, and output of the amplifier connected to the control node of the second pass transistor.

* * * * *